United States Patent [19]

Aoki

[11] Patent Number: 4,994,399

[45] Date of Patent: Feb. 19, 1991

[54] METHOD OF GETTERING HEAVY-METAL IMPURITIES FROM SILICON SUBSTRATES BY LASER-ASSISTED INTRINSIC GETTERING

[75] Inventor: Masaki Aoki, Kawasaki, Japan

[73] Assignee: Fujitsu Limited, Kawasaki, Japan

[21] Appl. No.: 524,034

[22] Filed: May 16, 1990

[30] Foreign Application Priority Data

May 16, 1989 [JP] Japan .................................. 1-122453

[51] Int. Cl.⁵ .......................................... H01L 21/322
[52] U.S. Cl. ......................................... 437/11; 437/10; 437/173; 148/DIG. 60; 148/DIG. 61
[58] Field of Search ...................... 437/11, 10; 148/DIG. 60, DIG. 61

[56] References Cited

U.S. PATENT DOCUMENTS

| | | | |
|---|---|---|---|
| 4,144,099 | 3/1979 | Edmonds et al. | 437/10 |
| 4,181,538 | 1/1980 | Norayan et al. | 437/11 |
| 4,314,595 | 2/1982 | Yamamoto et al. | 437/10 |
| 4,319,119 | 3/1982 | Runge | 437/11 |
| 4,376,657 | 3/1983 | Nagasawa et al. | 437/11 |
| 4,548,654 | 10/1985 | Tobin | 437/10 |
| 4,561,171 | 12/1985 | Schlosser | 437/10 |
| 4,668,304 | 5/1987 | Schachameyer et al. | 437/11 |
| 4,681,983 | 7/1987 | Markvort et al. | 148/DIG. 60 |
| 4,782,029 | 11/1988 | Takemura et al. | 437/11 |
| 4,851,358 | 7/1989 | Huber | 437/10 |

FOREIGN PATENT DOCUMENTS

| | | | |
|---|---|---|---|
| 0060676 | 9/1982 | European Pat. Off. | 437/10 |
| 0079484 | 5/1983 | European Pat. Off. | 437/11 |
| 0030457 | 6/1987 | European Pat. Off. | 437/11 |
| 0038828 | 4/1981 | Japan | 437/11 |
| 0204541 | 11/1983 | Japan | 437/10 |

*Primary Examiner*—Brian F. Hearn
*Assistant Examiner*—Gordon V. Hugo
*Attorney, Agent, or Firm*—Staas & Halsey

[57] ABSTRACT

A method of gettering heavy metal impurities from p-type silicon substrates comprises the prior step of forming an intrinsic gettering layer covered with a surface denuded zone in the silicon substrate by subjecting the substrate to heat treatments which form the intrinsic gettering layer having a large density of crystal microdefects compared to the density of crystal microdefects in the denuded zone; then the step of performing most of the required wafer processes other than the step of forming a metal layer; and subsequently the gettering step of heating the silicon substrate to a predetermined temperature and simultaneously irradiating the substrate with light rays, the predetermined temperature being selected to be within the temperature range 150° C. to 220° C., preferably around 200° C.

7 Claims, 5 Drawing Sheets

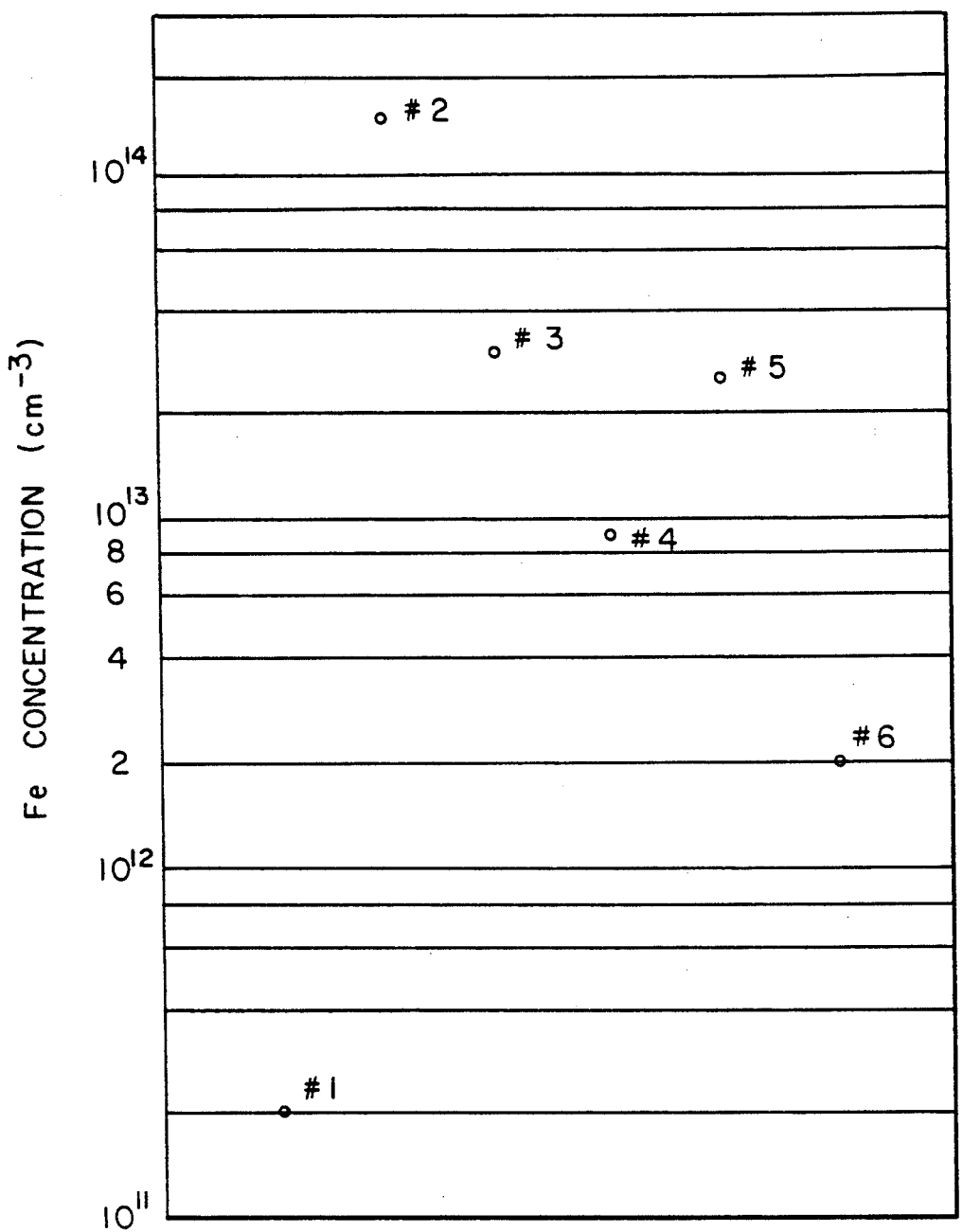

METHOD OF GETTERING HEAVY-METAL IMPURITIES FROM SILICON SUBSTRATES BY LASER-ASSISTED INTRINSIC GETTERING

BACKGROUND OF THE INVENTION

1. Field of the Invention

The present invention relates to a method of removing from a surface region of a silicon semiconductor substrate heavy metal impurities which are introduced into the substrate during wafer processing. More particularly, the present invention relates to a method of gettering heavy metal impurities, such as iron and chromium, which has been difficult to remove by a conventional intrinsic gettering method. As is known, if a CCD (charge coupled device) is used as an image sensor, heavy metal impurities introduced into the silicon substrate increase the level of an output signal of dark current, thus leading to a deterioration in sensor characteristics. The present invention is particularly effective when applied to gettering subsequent to wafer processing during CCD fabrication.

2. Description of the Related Art

In general, impurities such as a small amount of oxygen or carbon are introduced into silicon during the initial step of growing an ingot. It is, therefore, extremely difficult to avoid problems due to impurities, such as the contamination of wafers or the occurrence of crystal defects, in a device fabrication process using silicon wafers.

Gettering techniques are known for achieving good device characteristics by removing such impurities or incidental crystal defects from an element forming region. One gettering technique is called an IG (intrinsic gettering) technique in which impurity gettering is implemented by forming crystal defects in the interior of a silicon wafer and absorbing the impurities therein.

A typical example of the process of a known IG technique is explained below. In the process, prior to or in part during wafer processing, a silicon wafer is exposed to the following three steps of heat treatment in a nitrogen gas atmosphere.

Step (1) involves heat treatment of 30–60 minutes at 1100° C. In Step (1), oxygen impurities are removed from a wafer surface by outward diffusion to form a defect-free zone on the surface. Step (2) involves heat treatment of several hours at 700° C. In Step (2), nuclei of oxygen precipitation are produced in the interior of the wafer. In Step (3) involves heat treatment of 1 hour at 1000° C. In Step (3), oxygen is attracted to the nuclei of oxygen precipitation and increase the number of associated small defects, thereby increasing the ability of gettering.

The high-density defect-layer region in the wafer in which oxygen is precipitated throughout the above-described steps, is called an IG layer and a surface defect-free zone is called a DZ (denuded zone).

Manufacturing processes for silicon semiconductor devices, particularly wafer processes, encounter the problem of contamination due to metallic impurities. The contamination due to metallic impurities may cause increases in leakage currents at pn junctions or an incidental deterioration in voltage-resistance characteristics, or otherwise the lifetime decrease of carriers. Impurities which have particularly serious influences are heavy metal impurities such as iron (Fe), chromium (Cr), copper (Cu) and nickel (Ni). In the case of an image sensor employing a semiconductor device such as a CCD, junction leakage currents due to impurities in a photodetector region increase dark current and decrease device performance. In DRAMs, increases in junction leakage currents will require a short refresh time and cause imperfect refreshing.

The above-described known IG technique which serves the function of removing such heavy metal impurities from an active element region, effectively works on Cu, Ni or the like, but is not sufficiently effective on Fe and Cr.

To improve the performance of semiconductor devices, it is desired to establish a reliable gettering technique for the above-mentioned heavy metal impurities.

SUMMARY OF THE INVENTION

It is therefore an object of the present invention to provide a method of gettering heavy metal impurities, which cannot be removed by a conventional intrinsic gettering technique, from a region adjacent to the surface of a silicon wafer.

It is another object of the present invention to provide a manufacturing method in which prevention of leakage current in a semiconductor device employing a p-type silicon substrate is contemplated, particularly a manufacturing method which makes it possible to decrease dark current in a CCD type image sensor.

To achieve the above and other objects, a method of gettering heavy metal impurities from a p-type silicon substrate according to the present invention, comprises the steps of subjecting the silicon substrate to heat treatments to form an intrinsic gettering layer having a large density of crystal microdefects in the interior of the substrate, then carrying out the wafer processes required to manufacture semiconductor devices other than the formation of a metallic wiring layer, and subsequently heating the silicon substrate to approximately 200° C. and simultaneously irradiating the substrate with light rays, thereby absorbing the heavy metal impurities into the inner intrinsic gettering layer.

The above and other objects, features and advantages of the present invention will be apparent from the following description of a preferred embodiment of the invention with reference to the accompanying drawings.

BRIEF DESCRIPTION OF THE DRAWINGS

FIG. 2 is a graphic representation showing the results obtained by measuring variations in the surface Fe concentration of different p-type silicon wafer samples under various conditions including the presence or absence of Fe contamination, the presence or absence of an intrinsic gettering (IG) layer and differences in gettering processes;

DESCRIPTION OF THE PREFERRED EMBODIMENTS

To examine the cause of an increase in dark current in the photo-detection region of a CCD, a p-type silicon wafer passed through the same process was subjected to a DLTS (deep level transient spectroscopy) measurement to examine the state of heavy metal contamination.

It was found that iron (Fe) and boron (B) as an acceptor are present in the state of a Fe-B pair in silicon (Si).

Figure 1:
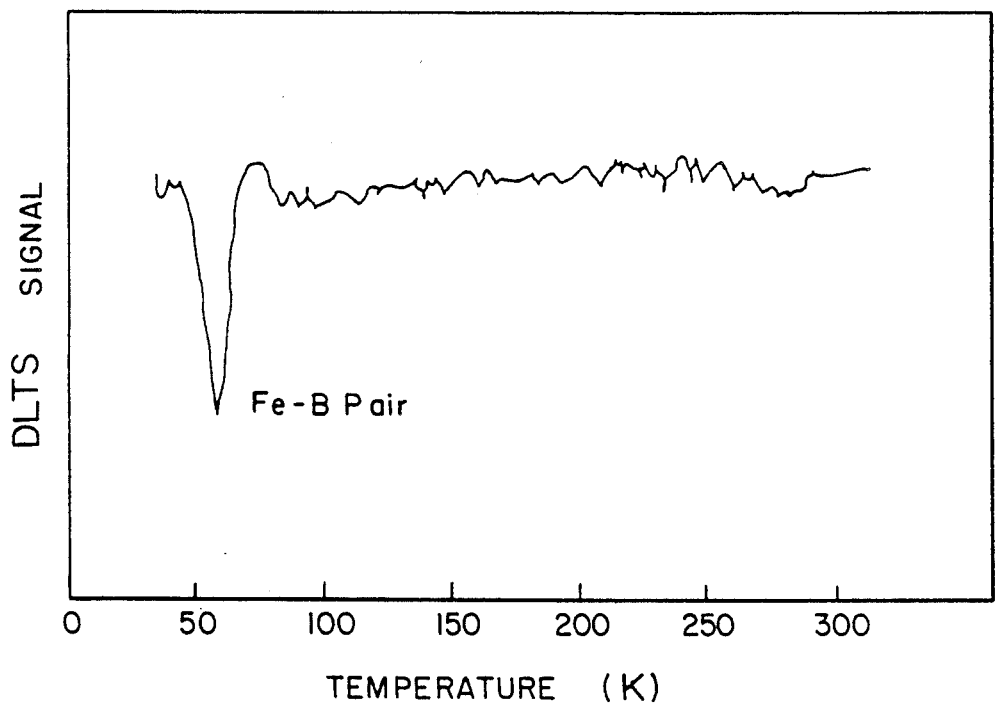
FIG. 1 is a graphic representation showing the result obtained by measuring Fe concentration by a DLTS method after a p-type silicon wafer has been exposed to heavy metal contamination.

FIG. 1 is a graphic representation showing the results of measurement utilizing a DLTS method. In a general DLTS measurement method, reverse pulse voltage is applied to a pn junction and the resulting capacitance is measured at times $t_1$ and $t_2$ after the application of the reverse pulse voltage. The measured capacitance difference $\Delta C$ is plotted with respect to temperature. For actual measurement, the temperature was changed from 40 K. to 320 K., and sampling times $t_1 = 200$ $\mu s$ and $t_2 = 2$ ms were selected. The vertical axis corresponds to a unit proportional to the aforesaid $\Delta C$. The illustrated abrupt decrease in signal level is caused by contamination due to impurities and its peak value is proportional to the concentration of the impurities. Since the peak is in the neighborhood of 60 k, the peak is found to correspond to the above-mentioned Fe-B pair by examining correlation with the measurement data obtained by an infrared absorption analysis, an ESR (electron spin resonance) analysis or the like.

The characteristics of heavy metal impurities which are contained in silicon are disclosed in the following documents, and detailed explanation is omitted.

(1) "Transition Metals in Silicon" by Eicke R. Weber; Appl. Phys., A30, 1-22 (1983); and
(2) "The Properties of Iron in Silicon" by K. Graff and H. Pieper; J. Electorochem. Soc., Vol. 128, No. 3 (1981).

In addition, an experiment was conducted to examine what degree of contamination due to heavy metal could be removed from the surface active region of a silicon wafer by the conventional IG technique described above.

The following three groups of samples were prepared.

Group No. 1: Although heat treatments for forming an IG layer on a wafer are performed, the wafer is not exposed to intentional Fe contamination.

Group No. 2: Heat treatments for forming an IG layer on a wafer are not performed and the wafer is exposed to Fe contamination.

Group No. 3: After heat treatments for forming an IG layer on a wafer have been performed, the wafer is exposed to Fe contamination.

In the aforesaid experiment, a B-doped p-type silicon wafer having a resistivity of 10 $\Omega cm$ and an oxygen-impurity concentration of $1.70-1.87 \times 10$ $cm^{-3}$ was used as a silicon wafer sample.

The heat treatments for IG-layer formation were conducted in three steps: at 1000° C. for 30 minutes, at 650° C. for six hours, and at 1000° C. for 30 minutes.

Each wafer was dipped in a 60% HNO3 solution containing 500 ppm of Fe ions. The surface concentration of the Fe impurities was $5.0 \times 10^{13}$ $cm^{-2}$.

The wafer sample of each group was finally subjected to a heat treatment of 1000° C. for 1 hour to diffuse Fe in the interior of the wafer sample, thereby effecting gettering. FIG. 2 shows the results. As can be seen from FIG. 2, the Fe concentration of Group No. 2 exposed to Fe contamination and devoid of an IG layer is about three digits greater than that of Group No. 1 which was not exposed to Fe contamination. In contrast, the Fe concentration of Group No. 3 exposed to Fe contamination and provided with an IG layer is as low as approximately one fifth of the Fe concentration of Group No. 2. However, Group No. 3 is approximately two digits greater in Fe concentration than Group No. 1, which means that ordinary IG methods do no provide satisfactory gettering.

The width of a denuded zone (DZ) of the wafer surface of Group No. 3 is approximately 12 $\mu m$, and the concentration of crystal defects in the IG layer is $5.0 \times 10^5$ $cm^{-2}$. It is to be understood, therefore, that effective IG treatment was achieved with respect to Group No. 3. These findings demonstrate that Fe which is heavy metal is extremely difficult to getter by ordinary IG techniques.

Figure 3:
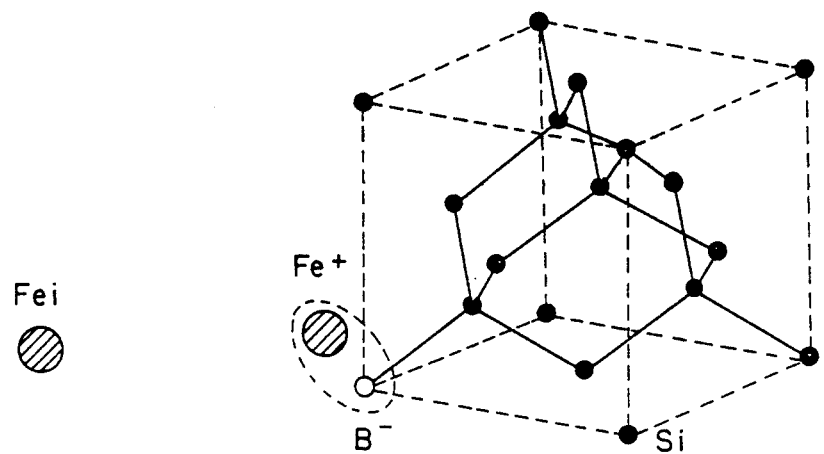
FIG. 3 is a diagrammatic view showing the crystalline structure obtained by introducing Fe impurities into a p-type silicone crystal, and shows that Fe may form either a Fe-B pair or interstitial Fei as the case may be.

As described in detail in the above-mentioned documents (1) and (2), it is known that the properties of Fe in a p-type (B-doped) Si crystal are divided into two kinds in accordance with the value of activation energy. One kind of Fe forms interstitial Fe (Fei) and the activation energy is represented as Ev +0.40eV. The other kind of Fe forms substitutional Fe which is paired with a dopant B to form Fe-B, and the activation energy is represented as Ev +0.10eV. FIG. 3 is a diagrammatic view showing the state where the aforesaid two kinds of Fe are presented in the crystal structure of silicon. In the drawing, the substitutional Fe is shown surrounded by dotted lines and an interstitial Fei is shown at a location away from the substitutional Fe.

In general, Fe of both Fei and Fe-B coexists and the total amount of Fe does not vary, but the Fe ratio of Fei to Fe-B varies due to various factors such as the hysteresis of heat treatments and the elapsed time thereafter. More specifically, when the wafer is quenched after heat treatments, a major part of Fe forms interstitial Fei. When a certain time period passes after the quenching, the interstitial Fei is gradually paired with B.

It has been found that the presence of Fe-B pairs hinders Fe concentration in a denuded zone from being sufficiently reduced by the conventional IG technique and that it is possible to reduce the Fe concentration in the denuded zone by reducing the number of Fe-B pairs and substituting interstitial Fei for them. According to the findings, the following experiment was conducted.

Figure 4:
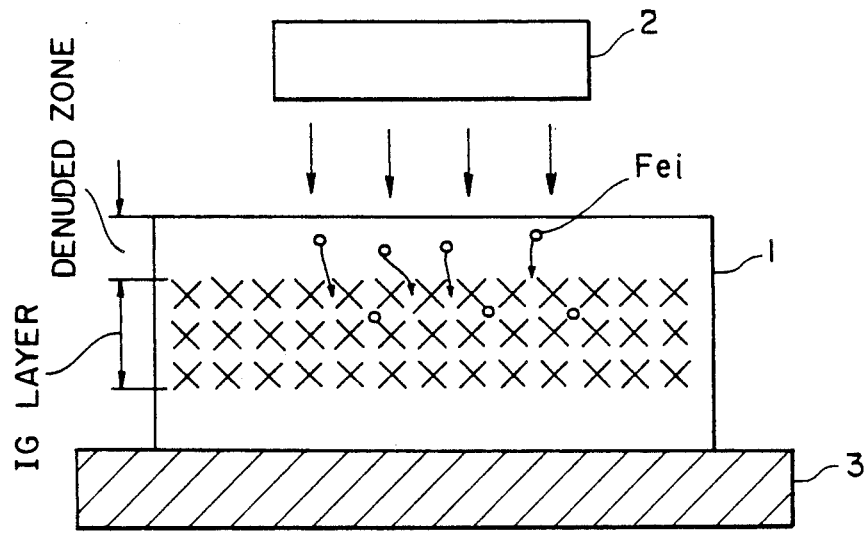
FIG. 4 is a diagrammatic view which serves to illustrate the principle of a gettering method according to the present invention.

FIG. 4 is a diagrammatic view which serve to illustrate the principle of the present invention. A p-type silicon wafer 1 is placed on a heating pad 3, and a light source 2 is disposed above the wafer 1. The light source 2 may be a white light source such as a halogen lamp or an ultraviolet rays light source. Since light has energy sufficient to dissociate Fe-B pairs, particularly large power is not needed. For example, it is sufficient that a 50-W light source be converged by a reflection mirror.

After the same heat treatments for forming an IG layer as those applied to Group No. 3 (1000° C., 30 minutes; 650° C., 6 hours; and 1000° C., 30 minutes) and a similar Fe contamination treatment (the dipping of each wafer sample in a 60% HNO₃ solution containing 500 ppm of Fe ions) were carried out, the following gettering treatments were performed.

Group No. 4: Heated at 200° C. for 6 hours;

Group No. 5: Irradiated by ultraviolet rays for six hours; and

Group No. 6: Heated at 200° C. and simultaneously irradiated by ultraviolet rays for six hours.

The results are shown in FIG. 2, and the DLTS characteristics of the respective groups No. 3–6 are shown in FIGS. 5(a)–5(d).

As can be seen from FIG. 2, the Fe concentration of Group No. 4 is as low as approximately one third of that of Group No. 3. The Fe concentration of Group No. 5 exposed to ultraviolet rays only is substantially the same as that of Group No. 3. This shows that, although the total amount of Fe does not change, the Fe concentration of Fe-B pairs decreases and that of interstitial Fei increases. The IG treatment applied to Group No. 6 is the most effective in that the Fe concentration is as low as approximately 1/10 the Fe concentration of Group No. 3. No crystal defect was observed in the denuded zone of each wafer sample.

The required heating temperature and time can be obtained by using the diffusion coefficient D of Fei which is given by the following equation described in the above-recited document (1):

$$D = 1.3 \times 10^{-3} \exp(-0.68[eV]/kT) \text{ cm}^2/\text{sec}$$

Figure 6:
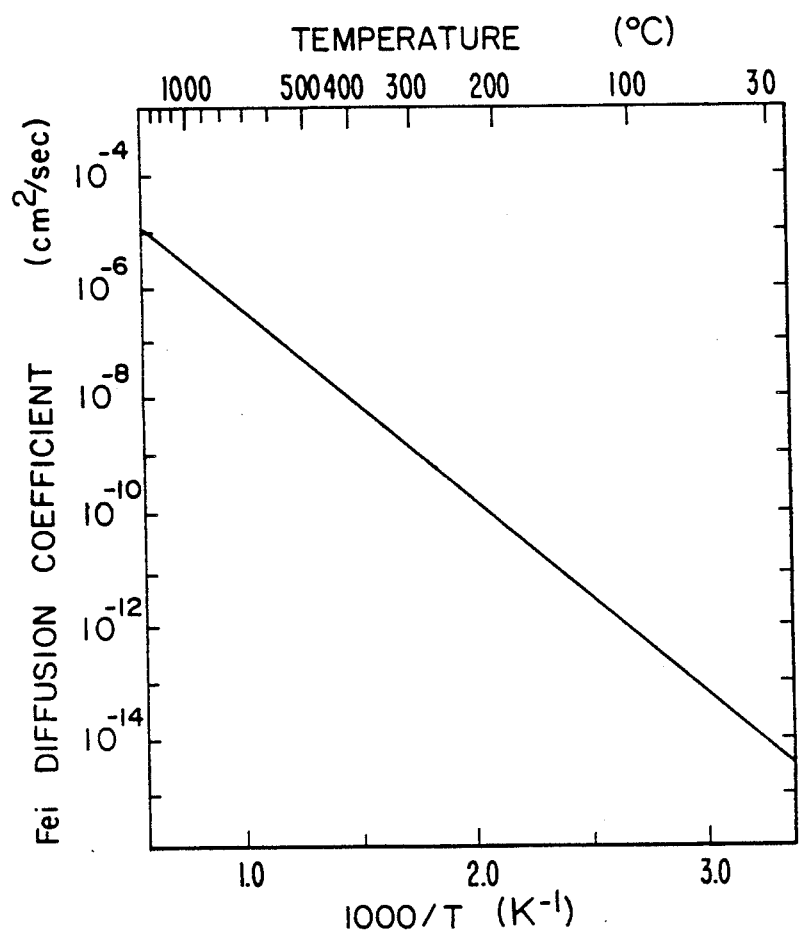
FIG. 6 is a graphic representation showing the relationship between the diffusion coefficient of Fei and the temperature.
Figure 5A:
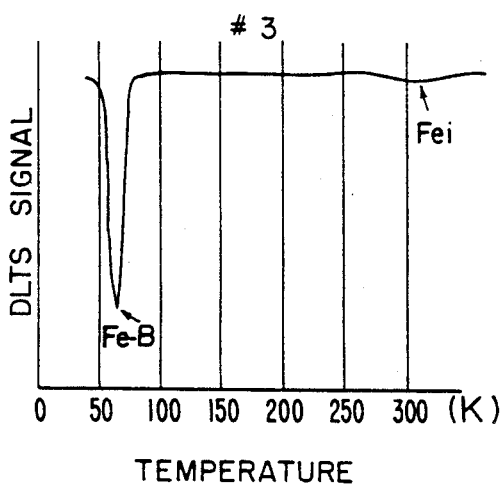
FIGS. 5(a)–5(d) are graphic representations showing the variations in DLTS measurement data which are obtained by changing gettering methods after a p-type silicon substrate has been exposed to Fe contamination.
Figure 5B:
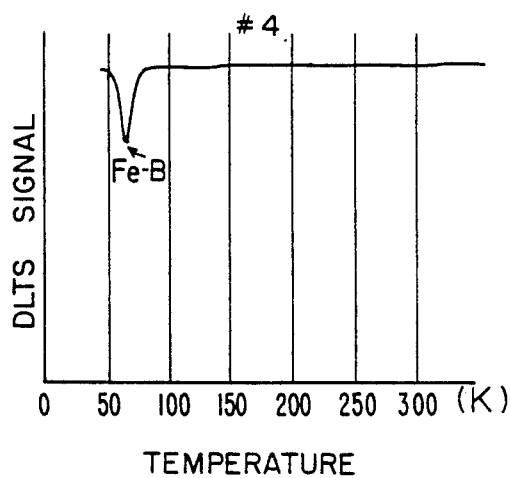
Figure 5C:
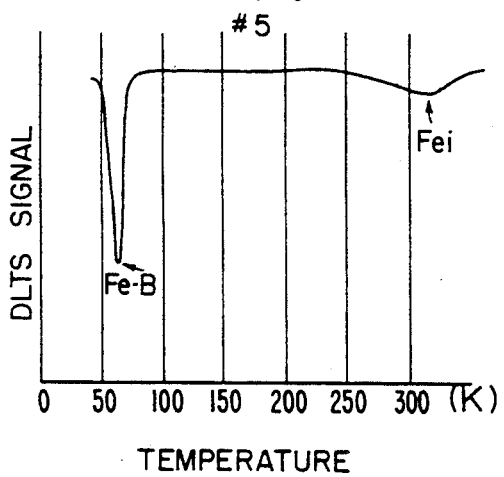
Figure 5D:
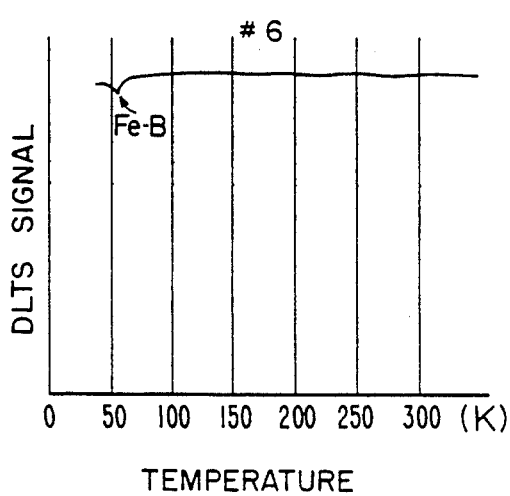

This equation is illustrated in FIG. 6 in graphic representation, and the following relations are obtained:

$$D = 5.7 \times 10^{-15} \text{ cm}^2/\text{sec (at 25° C.)}$$

$$D = 7.5 \times 10^{-11} \text{ cm}^2/\text{sec (at 200° C.)}$$

To assure a diffusion length x of 10 μm which is assigned to a width of the denuded zone DZ, 10 μm is substituted for x in $x = \sqrt{Dt}$ (t: diffusion time), then $$t = 4.9 \times 10^4 \text{ h (at 25° C.)}$$

$$t = 3.7 \text{ h (at 200° C.)}$$

Therefore, if the required processing time is to be reduced within reasonable duration, it is desirable that the required heating temperature be higher than about 150° C. (it takes approximately 28 hours at 150° C.).

However, since the amount of Fe precipitation gradually increases a the heating temperature becomes higher, it is not desirable that 220° C. be exceeded. Once Fe precipitates are produced, they are not reversibly converted to interstitial Fei even by light irradiation and it is therefore impossible to getter the Fe precipitates. When these conditions are considered, it is desirable that the heating temperature is selected to be at or around 200° C. It is practically sufficient that the heating time be four hours or more.

Figure 7:
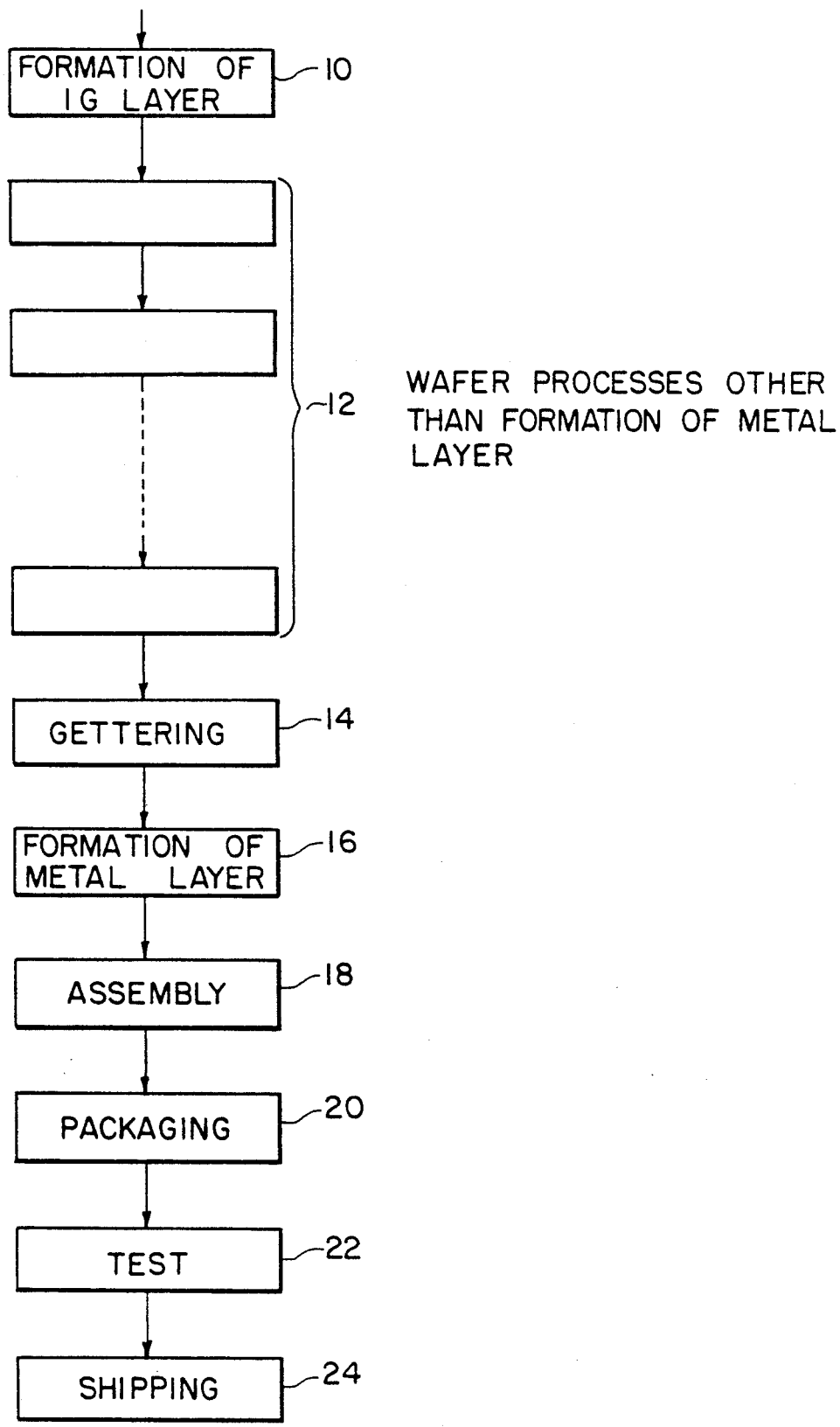
FIG. 7 shows in flow-chart form a semiconductor-device manufacturing process to which the present invention is applied.

It is desirable that the gettering treatment according to the present invention be carried out prior to metalization for forming a wiring pattern of aluminum throughout the entire wafer processes. This is because, once a metal layer is formed on a wafer surface, the effect of light irradiation according to the present invention is impaired. FIG. 7 is a flow chart showing a semiconductordevice manufacturing process to which the techniques of the present invention is applied.

In Step 10, a silicon wafer is subjected to heat treatments in accordance with the above-described schedule for the purpose of forming an IG layer. Subsequently, the wafer is passed through wafer processes 12 including a number of process steps other than a metal layer forming step 16. In the present invention, a gettering step 14 is performed before Step 16. This is because light irradiation is effectively carried out. It is desirable that, after gettering has been completed, a hightemperature processing step be not performed. Subsequent steps such as metal layer forming step 16, an assembly step 18, a packaging step 20, a test step 22 and a shipping step 24 are substantially the same as those of the conventional process.

The concentration of heavy metal impurities in a normal Si crystal (CZ, FZ) is reported to be on the order of $10^9$ cm$^{-3}$. However, a silicon wafer may be exposed to contamination up to $10^{10}$–$10^{14}$ cm$^{-3}$ in wafer processes. Accordingly, it is effective to perform the gettering treatment according to the present invention in a final stage of the wafer processing.

When the present invention was applied to a CCD type image sensor, the concentration of Fe-B was improved to $1 \times 10^{11}$ cm$^{-3}$ or lower from the data of $8 \times 10^{11}$ cm$^{-3}$ of the prior art. The failure of output signals of dark current (DS) was reduced to 1/10.

While the above embodiment has been explained with reference to Fe which is one kind of heavy metal impurities, the present invention may be likewise applied to Cr impurities since it is known that Cr also forms a Cr-B pair.

It will be appreciated from the foregoing that the present invention makes it possible to effectively reduce dark current in a CCD type image sensor which handles analog signals.

However, the present invention is not limited to the above-described range of applications, and is also effectively applied to the fabrication of ICs including MOS transistors or bipolar transistors with the object of reducing leakage current. In particular, a combination of the present invention and DRAMs provides marked effects since the power consumption of DRAMs can be reduced by preventing leakage current during their refreshing operations. When p-type silicon substrates are utilized, the above-described techniques such as the formation of an IG layer and a gettering treatment may be similarly applied.

While the present invention has been described with respect to what is presently considered to be the preferred embodiment, it is to be understood that the invention is not limited to the disclosed embodiment. To the contrary, the present invention is intended to cover various modifications included within the spirit and scope of the appended claims. The scope of the following claims is to be accorded the broadest interpretation so as to encompass all such modifications and equivalent functions.

What is claimed is:

1. A method of gettering heavy metal impurities combined with acceptor impurities in a silicon substrate, said method comprising the steps of:

(a) forming an intrinsic gettering layer covered with a surface denuded zone by subjecting said substrate to heat treatments, the intrinsic gettering layer having a large density of crystal microdefects compared to the density of crystal microdefects in the denuded zone;

(b) subjecting the substrate surface on which elements are to be formed to most of the required process steps other than formation of a metal layer; and (c) after said step (b), heating said substrate to a predetermined temperature and simultaneously irradiating said substrate with light rays, said predetermined temperature being selected to be lower than the precipitation temperature of said heavy metal impurities and enough for the heavy metal impurities to diffuse into said intrinsic gettering layer the energy level of said light being selected to be sufficient to dissociate the heavy metal impurities from the acceptor impurities.

2. A method of gettering heavy metal impurities as recited in claim 1, wherein said predetermined temperature ranges from 150° C. to 220° C., preferably around 200° C.

3. A method of gettering heavy metal impurities as recited in claim 1, wherein said heavy metal impurities are iron or chromium.

4. A method of gettering heavy metal impurities as recited in claim 1, further comprising Step (d) after said step (c), the step (d) including forming said metal layer for wiring.

5. A manufacturing method for a semiconductor device using a silicon substrate, wherein heavy metal impurities are combined with acceptor impurities of the substance, said method comprising the steps of:

(a) forming an intrinsic gettering layer covered with a surface denuded zone by subjecting said substrate to heat treatments, the intrinsic gettering layer having a larger density of crystal microdefects than the density of crystal microdefects in said denuded zone;

(b) subjecting the substrate surface on which the semiconductor device is to be formed to most of the required process steps other than formation of a metal layer; and (c) after Step (b), heating said substrate to a predetermined temperature and simultaneously irradiating said substrate with light rays, said predetermined temperature being selected to be lower than the precipitation temperature of said heavy metal impurities and enough for the heavy metal impurities to diffuse into said intrinsic gettering layer, the energy level of said light rays being selected to be sufficient to dissociate the heavy metal impurities from the acceptor impurities.

6. A manufacturing method for a semiconductor device as recited in claim 5, wherein said predetermined temperature ranges from 150° C. to 220° C., preferably around 200° C.

7. A manufacturing method for a semiconductor device as recited in claim 5, further comprising Step (d) after said step (c), the step (d) including forming said metal layer for wiring.

* * * * *